(12) United States Patent
Fang et al.

(10) Patent No.: US 6,716,755 B2
(45) Date of Patent: Apr. 6, 2004

(54) COMPOSITION AND METHOD FOR PLANARIZING SURFACES

(75) Inventors: Mingming Fang, Naperville, IL (US); Brian L. Mueller, Middletown, DE (US); James A. Dirksen, Oswego, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 10/340,561

(22) Filed: Jan. 10, 2003

(65) Prior Publication Data

US 2003/0124852 A1 Jul. 3, 2003

Related U.S. Application Data

(60) Division of application No. 09/625,142, filed on Jul. 25, 2000, now Pat. No. 6,527,817, which is a continuation-in-part of application No. 09/440,401, filed on Nov. 15, 1999, now Pat. No. 6,293,848.

(51) Int. Cl.$^7$ ............................................. H01L 21/302
(52) U.S. Cl. ....................... 438/690; 438/693; 451/28; 451/36; 451/41
(58) Field of Search ................................ 438/691, 692, 438/693

(56) References Cited

U.S. PATENT DOCUMENTS

| | | |
|---|---|---|
| 4,057,939 A | 11/1977 | Basi |
| 4,169,337 A | 10/1979 | Payne |
| 4,304,575 A | 12/1981 | Payne |
| 4,462,188 A | 7/1984 | Payne |
| 4,954,142 A | 9/1990 | Carr et al. |
| 4,959,113 A | 9/1990 | Roberts |
| 5,137,544 A | 8/1992 | Medellin |
| 5,228,886 A | 7/1993 | Zipperian |
| 5,264,010 A | 11/1993 | Brancaleoni et al. |
| 5,340,370 A | 8/1994 | Cadien et al. |
| 5,605,490 A | 2/1997 | Laffey et al. |
| 5,622,525 A | 4/1997 | Haisma et al. |
| 5,766,279 A | 6/1998 | Ueda et al. |
| 5,861,054 A | 1/1999 | Miyashita et al. |
| 5,868,604 A | 2/1999 | Atsugi et al. |
| 5,904,159 A | 5/1999 | Kato et al. |
| 6,132,298 A | 10/2000 | Zuniga et al. |

FOREIGN PATENT DOCUMENTS

| | | |
|---|---|---|
| WO | WO 97/13889 A1 | 4/1997 |

OTHER PUBLICATIONS

Patent Abstracts of Japan, vol. 2000, No. 05 (Sep.14, 2000)(JP 2000 042904 A (Feb. 15, 2000)).

Primary Examiner—Nadine G. Norton
Assistant Examiner—Duy-Vu Deo

(57) ABSTRACT

A composition and a method for planarizing or polishing a surface with the composition are provided. The composition comprises a liquid carrier, a chemical accelerator, and solids comprising about 5–90 wt. % of fumed metal oxide, and about 10–95 wt. % of abrasive particles, wherein about 90% or more of the abrasive particles (by number) have a particle size no greater than 100 nm. The composition of the present invention is useful in planarizing or polishing a surface with high polishing efficiency, uniformity, and removal rate, with minimal defectivity, such as field loss of underlying structures and topography.

32 Claims, No Drawings

COMPOSITION AND METHOD FOR PLANARIZING SURFACES

CROSS-REFERENCE TO RELATED PATENT APPLICATIONS

This patent application is a divisional of copending U.S. patent application Ser. No. 09/625,142, filed Jul. 25, 2000, issued as U.S. Pat. No. 6,527,817, which is a continuation-in-part of U.S. patent application Ser. No. 09/440,401, filed Nov. 15, 1999, issued as U.S. Pat. No. 6,293,848.

FIELD OF THE INVENTION

The present invention relates to a composition and method for planarizing or polishing a surface, such as the surface of a semiconductor or metal layer of a memory or rigid disk.

BACKGROUND OF THE INVENTION

Compositions for planarizing or polishing the surface of a substrate are well known in the art. Polishing slurries typically contain an abrasive material in an aqueous solution and are applied to a surface by contacting the surface with a polishing pad saturated with the slurry composition. Typical abrasive materials include silicon dioxide, cerium oxide, aluminum oxide, zirconium oxide, and tin oxide. U.S. Pat. No. 5,527,423, for example, describes a method for chemically-mechanically polishing a metal layer by contacting the surface with a polishing slurry comprising high purity fine metal oxide particles in an aqueous medium.

Conventional polishing compositions typically are not entirely satisfactory at planarizing semiconductor wafers. In particular, polishing slurries can have less than desirable polishing rates, and their use in chemically-mechanically polishing semiconductor surfaces can result in poor surface quality. Because the performance of a semiconductor wafer is directly associated with the planarity of its surface, it is crucial to use a polishing composition that has a high polishing efficiency, uniformity, and removal rate and leaves a high quality polish with minimal surface defects.

The difficulty in creating an effective polishing composition for semiconductor wafers stems from the complexity of the semiconductor wafer. Semiconductor wafers are typically composed of a substrate, on which a plurality of transistors has been formed. Integrated circuits are chemically and physically connected into a substrate by patterning regions in the substrate and layers on the substrate. To produce an operable semiconductor wafer and to maximize the yield, performance, and reliability of the wafer, it is desirable to polish select surfaces of the wafer without adversely affecting underlying structures or topography. In fact, various problems in semiconductor fabrication can occur if the process steps are not performed on wafer surfaces that are adequately planarized.

There have been many attempts to improve the polishing efficiency and uniformity of conventional polishing agents, while minimizing defectivity of the polished surface and damage to underlying structures or topography. For example, U.S. Pat. No. 5,340,370 describes a polishing composition comprising an abrasive, an oxidizing agent, and water, which purportedly yields an improved removal rate and polishing efficiency. Similarly, U.S. Pat. No. 5,622,525 describes a polishing composition comprising colloidal silica having an average particle size of 20–50 nm, a chemical activator, and demineralized water.

A need remains, however, for compositions and methods that will exhibit desirable planarization efficiency, uniformity, and removal rate during the polishing and planarization of substrates, while minimizing defectivity, such as surface imperfections and damage to underlying structures and topography during polishing and planarization. The present invention seeks to provide such a composition and method. These and other advantages of the present invention will be apparent from the description of the invention provided herein.

BRIEF SUMMARY OF THE INVENTION

The present invention is directed to a composition for planarizing or polishing a surface. The polishing composition of the present invention comprises (a) a liquid carrier, (b) a chemical accelerator, and (c) solids comprising about 5–90 wt. % of fumed metal oxide and about 10–95 wt. % of abrasive particles, wherein about 90% or more of the abrasive particles (i.e., by number) have a particle size no greater than 100 nm. The present invention also provides a method of planarizing or polishing a surface comprising contacting the surface with the composition of the present invention.

DETAILED DESCRIPTION OF THE INVENTION

The present invention provides a composition comprising (a) a liquid carrier, (b) a chemical accelerator, and (c) solids comprising about 5–90 wt. % of fumed metal oxide and about 10–95 wt. % of abrasive particles, wherein about 90% or more of the abrasive particles (by number) have a particle size no greater than 100 nm. The composition is useful in planarizing or polishing a surface. The present invention allows for a high polishing efficiency, uniformity, and removal rate of a surface with minimal defectivity, such as field loss of underlying structures and topography.

The total solids can be present in any suitable concentration in the composition of the present invention. The solids desirably are present in a concentration of about 0.1 wt. % or more (e.g., about 0.1–40 wt. %). Preferably, the total solids concentration is about 0.1–30 wt. % (e.g., about 1–30 wt. %) of the composition.

The solids of the composition of the present invention comprise about 5–90 wt. % of fumed metal oxide and about 10–95 wt. % of abrasive particles (i.e., the abrasive particles are at least about 10 wt. % of the total solids). The solids of the composition desirably comprise about 10–85 wt. % (e.g., about 15–75 wt. %) of fumed metal oxide and about 15–90 wt. % (e.g., about 25–85 wt. %) of abrasive particles (i.e., the abrasive particles are at least about 15 wt. % (e.g., at least about 25 wt. %) of the total solids). Preferably, the solids comprise about 15–60 wt. % (e.g., about 20–50 wt. %) of fumed metal oxide and about 40–85 wt. % (e.g., about 50–80 wt. %) of abrasive particles (i.e., the abrasive particles are at least about 40 wt. % (e.g., at least about 50 wt. %) of the total solids).

The fumed metal oxide of the composition of the present invention can be any suitable fumed (pyrogenic) metal oxide. Suitable fumed metal oxides include, for example, fumed alumina, fumed silica, fumed titania, fumed ceria, fumed zirconia, fumed germania, and fumed magnesia, coformed products thereof, cofumed products thereof, and mixtures thereof. Preferably, the fumed metal oxide of the composition of the present invention is fumed silica.

Any suitable abrasive particles can be present in the composition of the present invention. Desirable abrasive particles are metal oxides. Suitable metal oxides include alumina, silica, titania, ceria, zirconia, and magnesia. Also suitable for use in the composition are abrasive particles prepared in accordance with U.S. Pat. No. 5,230,833 and various commercially available products, such as the Akzo-Nobel Bindzil 50/80 product and the Nalco 1050, 2327, and 2329 products, as well as other similar products available from DuPont, Bayer, Applied Research, Nissan Chemical, and Clariant. Preferably, the abrasive particles of the composition of the present invention are a condensation-polymerized metal oxide, e.g., condensation-polymerized silica. Condensation-polymerized silica typically is prepared by condensing $Si(OH)_4$ to form colloidal particles.

The abrasive particles of the composition of the present invention are such that about 90% or more of the abrasive particles (by number) have a particle size no greater than 100 nm. Preferably, the abrasive particles are such that at least about 95%, 98%, or even substantially all (or actually all) of the abrasive particles (by number) have a particle size no greater than 100 nm. These particle size preferences for the abrasive particles (i.e., whereby at least about 90%, 95%, 98%, substantially all, and all of the abrasive particles (by number) are no greater than a specific size of abrasive particle) also can pertain to other particle sizes, such as 95 nm, 90 nm, 85 nm, 80 nm, 75 nm, 70 nm, and 65 nm.

Similarly, the abrasive particles of the composition of the present invention can be such that at least about 90%, 95%, 98%, or even substantially all (or actually all) of the abrasive particles (by number) have a particle size no less than 5 nm. These particle size preferences for the abrasive particles (i.e., whereby at least about 90%, 95%, 98%, substantially all, and all of the abrasive particles (by number) are no less than a specific size of abrasive particle) also can pertain to other particle sizes, such as 7 nm, 10 nm, 15 nm, 25 nm, and 30 nm.

The abrasive particles of the composition of the present invention can be essentially bimodal in distribution in terms of particle diameter, with about 30–70% (e.g., about 50%) of abrasive particles (by number) ranging in size from about 30–50 nm and about 30–70% (e.g., about 50%) of abrasive particles (by number) ranging in size from about 70–90 nm. Preferably, the abrasive particles are essentially bimodal in distribution in terms of particle diameter, with about 30–70% (e.g., about 50%) of abrasive particles (by number) ranging in size from about 35–45 nm and about 30–70% (e.g., about 50%) of abrasive particles (by number) ranging in size from about 75–85 nm.

The percentage values used herein to describe the nature of the abrasive particles in terms of particle size are percentages "by number," rather than being weight percentages, unless otherwise noted. The particle size of the abrasive particles refers to the particle diameter. The particle size can be measured by any suitable technique. The particle size values set forth herein are based on a visual inspection, specifically by way of transmission electron micrography (TEM), of a statistically significant sample of the abrasive particles, preferably at least 200 particles.

The particle size distribution of abrasive particles can be characterized by geometric standard deviation by number, referred to as sigma-g ($\sigma_g$). The $\sigma_g$ values can be obtained by dividing (a) the diameter at which 84% of the abrasive particles (by number) are less than by (b) the diameter at which 16% of the abrasive particles (by number) are less than (i.e., $\sigma_g = d_{84}/d_{16}$). Monodispersed abrasive particles have a $\sigma_g$ value of about 1. As the abrasive particles become polydispersed (i.e., include particles of increasingly different size), the $\sigma_g$ value of the abrasives particles increases above 1. The abrasive particles typically have a $\sigma_g$ value of about 2.5 or less (e.g., about 2.3 or less). The abrasive particles desirably have a $\sigma_g$ value of at least about 1.1 (e.g., about 1.1–2.3 (e.g., 1.1–1.3), preferably a $\sigma_g$ value of at least about 1.3 (e.g., about 1.5–2.3 or even about 1.8–2.3).

The composition of the present invention also can be characterized by packing density. The packing density is one minus the sedimentation volume of all of the composition components mixed together divided by the addition of the separate sedimentation volumes of the individual composition components. Thus, the packing density (PD) is $1-(V_{total}/(V_{fmo}+V_{ap}))$, wherein $V_{fmo}$ is the volume of the fumed metal oxide (in the absence of the abrasive particles), $V_{ap}$ is the volume of the abrasive particles (in the absence of the fumed metal oxide), and $V_{total}$ is the volume of the fumed metal oxide and abrasive particles mixed together. These volumes of the fumed metal oxide alone, abrasive particles alone, and the combination of the two in a mixed condition are determined by centrifuging the samples at any suitable G-force for a duration equal to 1.2× Stokes settling time of the smallest particle in the material for which the volume is being determined.

The composition desirably has a packing density value of at least about 0.1, preferably a packing density value of at least about 0.15. More preferably, the composition has a packing density value of at least about 0.2. Most preferably, the composition of the present invention has a packing density value of at least about 0.3 (e.g., about 0.3–0.6) or even at least about 0.4 (e.g., about 0.4–0.6 or about 0.5–0.6). The composition of the present invention typically has a packing density value of about 0.7 or less (e.g., about 0.65 or less or even about 0.6 or less).

Any suitable chemical accelerator can be present in the composition of the present invention. The chemical accelerator acts to improve the planarization or polishing of a substrate, for example, as evidenced by an increased rate of substrate removal.

Suitable chemical accelerators can include, for example, oxidizers, chelating or complexing agents, catalysts, and the like. Suitable oxidizers can include, for example, oxidized halides (e.g., chlorates, bromates, iodates, perchlorates, perbromates, periodates, mixtures thereof, and the like). Suitable oxidizers also can include, for example, perboric acid, perborates, percarbonates, nitrates, persulfates, peroxides, peroxyacids (e.g., peracetic acid, perbenzoic acid, m-chloroperbenzoic acid, salts thereof, mixtures thereof, and the like), permanganates, chromates, cerium compounds, ferricyanides (e.g., potassium ferricyanide), oxidizing metal salts (e.g., sodium salts, iron salts, potassium salts, aluminum salts, and the like), oxidizing metal complexes, nonmetallic oxidizing acids, ammonium salts, phosphonium salts, trioxides (e.g., vanadium trioxide), mixtures thereof, and the like.

Suitable chelating or complexing agents can include, for example, carbonyl compounds (e.g., acetylacetonates, and the like), simple carboxylates (e.g., acetates, aryl carboxylates, and the like), carboxylates containing one or more hydroxyl groups (e.g., glycolates, lactates, gluconates, gallic acid and salts thereof, and the like), di-, tri-, and poly-carboxylates (e.g., oxalates, phthalates, citrates, succinates, tartrates, malates, edetates (e.g., disodium EDTA), mixtures thereof, and the like), carboxylates containing one or more sulfonic and/or phosphonic groups, and the like. Suitable chelating or complexing agents also can include, for example, di-, tri-, or poly-alcohols (e.g., ethylene glycol, pyrocatechol, pyrogallol, tannic acid, and the like), halides (i.e., fluorides, chlorides, bromides, and iodides), and the like. Suitable chemical accelerators also can include, for example, sulfur-containing compounds, e.g., thiols, thioesters, thioethers, and sulfates, and nitrogen-containing compounds, e.g., amines, imines, amides, and imides. Suitable nitrogen-containing compounds include, for example, primary amines, secondary amines, tertiary amines, quartenary amines, etheramines, hydroxylated amines, amino alcohols, amino ether alcohols, amino acids (e.g., glycine, alanine, iminodiacetic acid, valine, leucine, isoleucine, serine, and/or threonine), oligomeric amines, oligomeric imines, oligomeric amides, oligomeric imides, polymeric amines, polymeric imines, polymeric amides, polymeric imides, and mixtures thereof.

Moreover, suitable chemical accelerators can include, for example, phosphate ions (as defined by the chemical structure $PO_4$, wherein the structure comprises a double bond (P=O)), phosphonate ions (as defined by the chemical structures RO—$PO_3$ or $R_2O_2$—$PO_2$, wherein the structures comprise a double bond (P=O), and wherein R is an organic moiety, typically, an organic moiety selected from the group consisting of an alkyl moiety, an aryl moiety, a cyclic moiety, an aromatic moiety, and a heteroatom-containing organic moiety (e.g., an N-containing organic moiety)), or combinations thereof. The phosphate ion can be derived from any suitable source of phosphate ion. Suitable sources of phosphate ion include, for example, phosphoric acids and water-soluble phosphates, e.g., orthophosphates, polyphosphates, and mixtures thereof. The source of phosphate ion also can be selected from the group consisting of pyrophosphates, tripolyphosphates, and mixtures thereof. Preferably, the source of phosphate ion is selected from the group consisting of a sodium phosphate, a potassium phosphate, a lithium phosphate, a cesium phosphate, a magnesium phosphate, an ammonium phosphate, phosphoric acid, and the like, and mixtures thereof. The phosphonate ion can be derived from any suitable source of phosphonate ion. Suitable sources of phosphonate ion include, for example, amine-containing phosphonates, imine-containing phosphonates, imide-containing phosphonates, amide-containing phosphonates, phosphonate compounds containing no nitrogen (e.g., phosphonates containing no amine groups), and mixtures thereof. Preferably, the source of phosphonate ion is selected from the group consisting of phosphoacetic acid, 2-aminoethyl dihydrogen phosphate, aminotri-(methylenephosphonic acid), nitrilotris (methylene)triphosphonic acid, 1-hydroxyethylidene-1-diphosphonic acid, and diethylenetriaminepenta-(methylenephosphonic acid), and mixtures thereof.

It will be appreciated that many of the aforementioned compounds can exist in the form of a salt (e.g., a metal salt, an ammonium salt, or the like), an acid, or as a partial salt. For example, citrates include citric acid, as well as mono-, di-, and tri-salts thereof; phthalates include phthalic acid, as well as mono-salts (e.g., potassium hydrogen phthalate) and di-salts thereof; perchlorates include the corresponding acid (i.e., perchloric acid), as well as salts thereof.

Furthermore, certain compounds can perform more than one function. For example, some compounds can function both as an oxidizing agent and a chelating agent (e.g., ammonium persulfate, hydroxylamine nitrate, and the like). In addition, the composition of the present invention can comprise two or more chemical accelerators, e.g., three or more chemical accelerators, or even four or more chemical accelerators. In this regard, the chemical accelerators can function in a manner as to bring about an enhanced or even a synergistic effect. For example, the composition of the present invention can comprise an oxidizing agent and a complexing agent. In that respect, preferably, the composition of the present invention comprises an oxidizing agent and an amino acid, such as, for example, glycine, alanine, iminodiacetic acid, valine, leucine, isoleucine, serine, and/or threonine. Similarly, the composition can comprise an oxidizing agent and a phosphate-containing compound or can comprise an oxidizing agent and a carboxylate compound. In that respect, preferably, the composition of the present invention comprises hydrogen peroxide and glycine.

Any suitable amount of chemical accelerator can be present in the composition of the present invention. The chemical accelerator desirably is present in the polishing composition in an amount of about 0.01–20 wt. % (i.e., about 0.01–15 wt. %). Preferably, the chemical accelerator is present in the composition of the present invention in an amount of about 0.1–10 wt. %. More preferably, the chemical accelerator is present in the composition of the present invention in an amount of about 0.1–5 wt. % (i.e., about 0.1–2 wt. %).

The composition of the present invention can further comprise one or more other components, such as surfactants, polymeric stabilizers or other surface active dispersing agents, pH adjusters, regulators, or buffers, and the like. Suitable surfactants can include, for example, cationic surfactants, anionic surfactants, nonionic surfactants, amphoteric surfactants, fluorinated surfactants, mixtures thereof, and the like. Suitable polymeric stabilizers or other surface active dispersing agents can include, for example, phosphoric acid, organic acids, tin oxides, organic phosphonates, mixtures thereof, and the like. Suitable pH adjusters, regulators, or buffers can include, for example, sodium hydroxide, sodium carbonate, sulfuric acid, hydrochloric acid, nitric acid, phosphoric acid, citric acid, potassium phosphate, mixtures thereof, and the like.

Any suitable carrier (e.g., solvent) can be used in the composition of the present invention. A carrier is used to facilitate the application of the fumed metal oxide and abrasive particles onto the surface of a suitable substrate. A preferred carrier is water.

The pH of the composition of the present invention is maintained in a range suitable for its intended end-use. The composition desirably has a pH of about 2–12. The preferred pH will depend on the particular chemical accelerator. For example, when the chemical accelerator is ammonium persulfate and $NH_3$, then the pH preferably is about 9–11. When the chemical accelerator is iron (III) nitrate, then the pH preferably is about 2.5 or less, more preferably about 2. When the chemical accelerator is hydroxylamine nitrate, then the pH preferably is about 2–5.

The present invention also provides a method of planarizing or polishing a surface. This method comprises contacting a surface with a composition as described herein. A surface can be treated with the composition by any suitable technique. For example, the composition can be applied to the surface through use of a polishing pad.

The composition of the present invention is capable of planarizing or polishing a substrate at a relatively high rate, e.g., removing the silicon dioxide layer from a layered substrate at a relatively high rate. Furthermore, the composition of the present invention is well-suited for the planarizing or polishing of many hardened workpieces, such as memory or rigid disks, metals (e.g., noble metals), ILD layers, semiconductors, micro-electro-mechanical systems, ferroelectrics, magnetic heads, polymeric films, and low and high dielectric constant films. The composition also can be used in the manufacture of integrated circuits and semiconductors. The composition of the present invention exhibits desirable planarization efficiency, uniformity, removal rate, and low defectivity during the polishing and planarization of substrates.

EXAMPLES

The following examples further illustrate the present invention but, of course, should not be construed as in any way limiting its scope.

The memory or rigid disks, referenced in all but one of the following examples (i.e., Example 5), were commercially available memory or rigid disks obtained from Seagate Technology. The memory or rigid disks were nickel-phosphor coated (plated) disks with aluminum substrates. The memory or rigid disks had undergone a pre-polishing process prior to being used in the following examples, and each memory or rigid disk had a surface roughness of 30–50 Å.

The memory or rigid disks were polished using a table top polishing machine manufactured by Streuers (West Lake, Ohio). The table top polishing machine employed a Rotopol 31 base and Rotoforce 3 downforce unit. The polishing pads used in each of the following examples were 30.48 cm (12 inch) diameter Polytex Hi pads manufactured by Rodel. The memory or rigid disks were polished for 10 minutes per side, using a platen speed of 150 rpm, a polishing carrier speed of 150 rpm, and a slurry flow rate of 100 ml/min, with the exception of the memory or rigid disks in Example 6, which were polished for 5 minutes. The polishing force used in all examples was 50 N.

Nickel-phosphor removal rates in each of the following examples were calculated by weighing the clean, dry memory or rigid disk prior to polishing and following polishing. The weight loss was converted to a memory or rigid disk thickness loss using a nickel-phosphor density of 8.05 g/cm$^3$.

Example 1

This example illustrates the significance of the combination and ratio of fumed metal oxide to abrasive particles in the composition of the present invention, as well as the presence of a chemical accelerator, in maximizing the removal rate of a surface during planarization or polishing of that surface.

Nickel-phosphor plated memory or rigid disks were polished separately with ten different compositions with total solids concentrations comprising varying relative concentrations of fumed silica (i.e., 0 wt. %, 25 wt. %, 50 wt. %, 75 wt. %, and 100 wt. %), condensation-polymerized silica (i.e., 100 wt. %, 75 wt. %, 50 wt. %, 25 wt. %, and 0 wt. %) (measured median particle size of about 20 nm, $\sigma_g$=2.26), and hydroxyamine nitrate (HAN) (i.e., either 0 wt. % HAN or 0.25 wt. % HAN). All of the compositions had a pH of about 3.5. The fumed silica was added to the compositions in the form of Cab-O-Sperse® SC-E fumed silica aqueous dispersion (Cabot Corporation). The condensation-polymerized silica was Bindzil® 50/80 (Akzo-Nobel), wherein about 90% or more of the particles thereof (by number) have a particle size no greater than 100 nm and about 90% or more of the particles thereof (by number) have a particle size no less than 5 nm. Following use of the polishing compositions, the removal rate of each composition was determined, with the resulting data set forth in Table 1.

TABLE 1

| Composition | Relative Wt. % Fumed Silica | Relative Wt. % Condensation-polymerized Silica | Removal Rate (micro inch per minute) [Å/min] | |
|---|---|---|---|---|
| | | | No HAN | 0.25 Wt. % HAN |
| 1A | 0 | 100 | 2.10 [534] | 2.70 [686] |
| 1B | 25 | 75 | 2.28 [579] | 3.40 [864] |
| 1C | 50 | 50 | 2.28 [579] | 3.89 [988] |
| 1D | 75 | 25 | 2.10 [534] | 5.70 [1448] |
| 1E | 100 | 0 | 1.41 [358] | 1.70 [216] |

As is apparent from the data set forth in Table 1, the removal rates exhibited by the compositions with HAN were significantly greater than the removal rates of compositions without HAN. Moreover, the removal rates for compositions with HAN and solids consisting of about 25–75 wt. % fumed silica and 25–75 wt. % condensation-polymerized silica (Compositions 1B, 1C, and 1D) were greater than the removal rates for compositions with HAN and solids consisting of 100 wt. % fumed silica or 100 wt. % condensation-polymerized silica (Compositions 1A and 1E). These results demonstrate the significance of a combination of a chemical accelerator and a mixture of fumed metal oxide and abrasive particles possessing the particle size characteristics described herein, as well as the ratio of fumed metal oxide to abrasive particles, on the removal rate achievable by the composition of the present invention.

Example 2

This example illustrates the significance of the combination and ratio of fumed metal oxide to abrasive particles in the composition of the present invention, as well as the presence of a chemical accelerator, in maximizing the removal rate of a surface during planarization or polishing of that surface.

Nickel-phosphor plated memory or rigid disks were polished separately with ten different compositions with total solids concentrations comprising varying relative concentrations of fumed silica (i.e., 0 wt. %, 25 wt. %, 50 wt. %, 75 wt. %, and 100 wt. %), condensation-polymerized silica (i.e., 100 wt. %, 75 wt. %, 50 wt. %, 25 wt. %, and 0 wt. %) (measured median particle size of about 20 nm, $\sigma_g$=2.26), ammonium persulfate (APS) and NH$_3$ (i.e., either 0.25 wt. % APS and 0.25 wt. % NH$_3$ or 0 wt. % APS and 0 wt. % NH$_3$). All of the compositions had a pH of about 10. The fumed silica was added to the compositions in the form of Cab-O-Sperse® SC-E fumed silica aqueous dispersion (Cabot Corporation). The condensation-polymerized silica was Bindzil® 50/80 (Akzo-Nobel), wherein about 90% or more of the particles thereof (by number) have a particle size no greater than 100 nm and about 90% or more of the particles thereof (by number) have a particle size no less than 5 nm. Following use of the polishing compositions, the removal rate of each composition was determined, with the resulting data set forth in Table 2.

TABLE 2

| Composition | Relative Wt. % Fumed Silica | Relative Wt. % Condensation-polymerized Silica | Removal Rate (micro inch per minute) [Å/min] | |
|---|---|---|---|---|
| | | | No APS No NH$_3$ | 0.25 Wt. % APS 0.25 Wt. % NH$_3$ |
| 2A | 0 | 100 | 2.10 [534] | 2.80 [711] |
| 2B | 25 | 75 | 2.28 [579] | 6.40 [1626] |
| 2C | 50 | 50 | 2.28 [579] | 4.60 [1169] |
| 2D | 75 | 25 | 2.10 [534] | 3.20 [813] |
| 2E | 100 | 0 | 1.41 [358] | 0.85 [216] |

As is apparent from the data set forth in Table 2, the removal rates exhibited by the compositions with APS and NH$_3$ were significantly greater than the removal rates of compositions without APS and NH$_3$, except for the composition consisting of 100 wt. fumed silica. In particular, the removal rates for compositions with APS and NH$_3$ and solids consisting of about 25–75 wt. % fumed silica and 25–75 wt. % condensation-polymerized silica (Compositions 2B, 2C, and 2D) were greater than the removal rates for compositions with APS and NH$_3$ and solids consisting of 100 wt. % fumed silica or 100 wt. % condensation-polymerized silica (Compositions 2A and 2E). These results demonstrate the significance of a combination of a chemical accelerator and a mixture of fumed metal oxide and abrasive particles possessing the particle size characteristics described herein, as well as the ratio of fumed metal oxide to abrasive particles, on the removal rate achievable by the composition of the present invention.

Example 3

This example illustrates the significance of the combination and ratio of fumed metal oxide to abrasive particles in the composition of the present invention, as well as the presence of a chemical accelerator, in maximizing the removal rate of a surface during planarization or polishing of that surface.

Nickel-phosphor plated memory or rigid disks were polished separately with ten different compositions with total solids concentrations comprising varying relative concentrations of fumed silica (i.e., 0 wt. %, 25 wt. %, 50 wt. %, 75 wt. %, and 100 wt. %), condensation-polymerized silica (i.e., 100 wt. %, 75 wt. %, 50 wt. %, 25 wt. %, and 0 wt. %) (measured median particle size of about 20 nm, σ$_g$=2.26), and Fe(NO$_3$)$_3$ (i.e., either 0 wt. % Fe(NO$_3$)$_3$ or 0.25 wt. % Fe(NO$_3$)$_3$). All of the compositions had a pH of about 2. The fumed silica was added to the compositions in the form of Cab-O-Sperse® SC-E fumed silica aqueous dispersion (Cabot Corporation). The condensation-polymerized silica was Bindzil® 50/80 (Akzo-Nobel), wherein about 90% or more of the particles thereof (by number) have a particle size no greater than 100 nm and about 90% or more of the particles thereof (by number) have a particle size no less than 5 nm. Following use of the polishing compositions, the removal rate of each composition was determined, with the resulting data set forth in Table 3.

TABLE 3

| Composition | Relative Wt. % Fumed Silica | Relative Wt. % Condensation-polymerized Silica | Removal Rate [Å/min] | |
|---|---|---|---|---|
| | | | No Fe(NO$_3$)$_3$ | 0.25 Wt. % Fe(NO$_3$)$_3$ |
| 3A | 0 | 100 | 534 | 1653 |
| 3B | 25 | 75 | 534 | 1907 |
| 3C | 50 | 50 | 579 | 2161 |
| 3D | 75 | 25 | 579 | 2314 |
| 3E | 100 | 0 | 358 | 1424 |

As is apparent from the data set forth in Table 3, the removal rates exhibited by the compositions with Fe(NO$_3$)$_3$ were significantly greater than the removal rates of compositions without Fe(NO$_3$)$_3$. In particular, the removal rates for compositions with Fe(NO$_3$)$_3$ and solids consisting of about 25–75 wt. % fumed silica and 25–75 wt. % condensation-polymerized silica (Compositions 3B, 3C, and 3D) were greater than the removal rates for compositions with Fe(NO$_3$)$_3$ and solids consisting of 100 wt. % fumed silica or 100 wt. % condensation-polymerized silica (Compositions 3A and 3E). These results demonstrate the significance of a combination of a chemical accelerator and a mixture of fumed metal oxide and abrasive particles possessing the particle size characteristics described herein, as well as the ratio of fumed metal oxide to abrasive particles, on the removal rate achievable by the composition of the present invention.

Example 4

This example illustrates the significance of the distribution of abrasive particle sizes in the composition of the present invention in maximizing the removal rate of a surface during polishing or planarization of that surface.

Nickel-phosphor wafers were polished separately with nineteen different compositions, all having 0.25 wt. % hydroxylamine nitrate (HAN) and a total solids concentration of 4 wt. %, wherein the solids consisted of a varying concentration of fumed silica (1.6 wt. %, 2.4 wt. %, and 3.2 wt. % of the composition, or 40 wt. %, 60 wt. %, and 80 wt. % of the total solids, respectively) and a varying concentration of condensation-polymerized silica (2.4 wt. %, 1.6 wt. %, and 0.8 wt. % of the composition, or 60 wt. %, 40 wt. %, and 20 wt. % of the total solids, respectively), with the condensation-polymerized silica having varying relative concentrations of nominal 20 nm, 40 nm, and 80 nm condensation-polymerized silica particles (i.e., 0 wt. %, 0.4 wt. %, 0.8 wt. %, 1.2 wt. %, 1.6 wt. %, and 2.4 wt. % of the composition). All of the compositions had a pH of about 3.5. The fumed silica was added to the compositions in the form of Cab-O-Sperse® SC-E fumed silica aqueous dispersion (Cabot Corporation). The 20 nm, 40 nm, and 80 nm condensation-polymerized silicas were 1050, PR-4291, and 2329 products (Nalco), respectively. The nominal 20 nm condensation-polymerized silica particles had a median particle size of about 25 nm and a σ$_g$ value of 1.20. The nominal 40 nm condensation-polymerized silica particles had a median particle size of about 46 nm and a σ$_g$ value of 1.22. The nominal 80 nm condensation-polymerized silica particles had a median particle size of about 78 nm and a σ$_g$ value of 1.16. The condensation-polymerized silicas are commercially available materials wherein about 90% or more of the particles thereof (by number) has a particle size no greater than 100 nm and about 90% or more of the particles thereof (by number) have a particle size no less than 5 nm. Following use of the polishing compositions, the removal rate of each composition was determined, with the resulting data set forth in Table 4.

TABLE 4

| Composition | Wt. % Fumed Silica | Wt. % Nominal 20 nm Silica | Wt. % Nominal 40 nm Silica | Wt. % Nominal 80 nm Silica | Removal Rate [Å/min] |
|---|---|---|---|---|---|
| 4A1 | 3.2 | 0.8 | 0 | 0 | 1471 |
| 4A2 | 3.2 | 0 | 0.8 | 0 | 1326 |
| 4A3 | 3.2 | 0 | 0 | 0.8 | 1634 |
| 4B1 | 2.4 | 1.6 | 0 | 0 | 1021 |
| 4B2 | 2.4 | 0 | 1.6 | 0 | 1474 |
| 4B3 | 2.4 | 0 | 0 | 1.6 | 1639 |
| 4C1 | 1.6 | 2.4 | 0 | 0 | 826 |
| 4C2 | 1.6 | 0 | 2.4 | 0 | 788 |
| 4C3 | 1.6 | 0 | 0 | 2.4 | 1123 |
| 4D1 | 3.2 | 0.4 | 0.4 | 0 | 1748 |
| 4D2 | 3.2 | 0.4 | 0 | 0.4 | 1855 |
| 4D3 | 3.2 | 0 | 0.4 | 0.4 | 1685 |
| 4E1 | 2.4 | 0.8 | 0.8 | 0 | 1324 |
| 4E2 | 2.4 | 0.8 | 0 | 0.8 | 1283 |
| 4E3 | 2.4 | 0 | 0.8 | 0.8 | 1484 |
| 4F1 | 1.6 | 1.2 | 1.2 | 0 | 1207 |
| 4F2 | 1.6 | 1.2 | 0 | 1.2 | 1242 |
| 4F3 | 1.6 | 0 | 1.2 | 1.2 | 1143 |
| 4G1 | 3.2 | 0.267 | 0.267 | 0.267 | 2002 |

As is apparent from the data set forth in Table 4, the removal rates exhibited by the compositions comprising hydroxylamine nitrate and solids consisting of a mixture of fumed silica and condensation-polymerized silica varied significantly with the particle sizes of the condensation-polymerized silica. These results demonstrate that the distribution of abrasive particle sizes in the composition of the present invention affects the removal rate achievable by the composition.

Example 5

This example illustrates the significance of the combination and ratio of fumed metal oxide to abrasive particles in the composition of the present invention, as well as the presence of a chemical accelerator, in maximizing the removal rate of a metal surface during planarization or polishing of that surface.

Tungsten layers were polished separately with five different compositions, all having 4 wt. % hydrogen peroxide, 0.005 wt. % Fe (from ferric nitrate), 0.05 wt. % glycine, 0.03 wt. % malonic acid, and a total solids concentration of 2 wt. %, wherein the solids consisted of a varying concentration of fumed silica (i.e., 0 wt. %, 60 wt. %, 75 wt. %, 90 wt. %, and 100 wt. %), and a varying relative concentration of condensation-polymerized silica (i.e., 100 wt. %, 40 wt. %, 25 wt. %, 10 wt. %, and 0 wt. %) (measured median particle size of about 40 nm, $\sigma_g$=1.22). All of the compositions had a pH of about 2.3. The fumed silica was added to the compositions in the form of an aqueous dispersion of Cab-O-Sil® LM-150 fumed silica (Cabot Corporation). The condensation-polymerized silica was PR-4291 (Nalco), wherein the nominal 40 nm condensation-polymerized silica particles had a median particle size of about 46 nm and a $\sigma_g$ value of 1.22. Following use of the polishing compositions, the removal rate of each composition was determined, with the resulting data set forth in Table 5.

TABLE 5

| Composition | Relative Wt. % Fumed Silica | Relative Wt. % Condensation-polymerized Silica | Removal Rate [Å/min] |
|---|---|---|---|
| 5A | 0 | 100 | 2062 |
| 5B | 60 | 40 | 2001 |
| 5C | 75 | 25 | 2046 |
| 5D | 90 | 10 | 2715 |
| 5E | 100 | 0 | 2234 |

As is apparent from the data set forth in Table 5, the removal rate exhibited by the compositions with solids consisting of about 90 wt. % fumed silica and 10 wt. % condensation-polymerized silica (Composition 5D) was greater than the removal rates for compositions with solids consisting of 100 wt. % fumed silica or 100 wt. % condensation-polymerized silica (Compositions 5A and 5E). These results demonstrate the significance of a combination of fumed metal oxide and abrasive particles possessing the particle size characteristics described herein, as well as the ratio of fumed metal oxide to abrasive particles, on the removal rate achievable by the composition of the present invention.

Example 6

This example illustrates the significance of the combination and ratio of fumed metal oxide to abrasive particles in the composition of the present invention, as well as the combination of chemical accelerators, in maximizing the removal rate of a surface during planarization or polishing of that surface.

Nickel-phosphor plated memory or rigid disks were polished separately with five different compositions with 4 wt. % total solids concentrations comprising varying concentrations of fumed silica (i.e., 0 wt. %, 1 wt. %, 2 wt. %, 3 wt. %, and 4 wt. %) and condensation-polymerized silica (i.e., 4 wt. %, 3 wt. %, 2 wt. %, 1 wt. %, and 0 wt. %) (measured median particle size of about 20 nm, $\sigma_g$=2.26), 1.5 wt. % of a first chemical accelerator (i.e., $H_2O_2$), and 1 wt. % of a second chemical accelerator (i.e., glycine). All of the compositions had a pH of about 2.5. The fumed silica was added to the compositions in the form of Cab-O-Sperse® SC-1 fumed silica aqueous dispersion (Cabot Corporation). The condensation-polymerized silica was Bindzil® 50/80 (Akzo-Nobel), wherein about 90% or more of the particles thereof (by number) have a particle size no greater than 100 nm and about 90% or more of the particles thereof (by number) have a particle size no less than 5 nm. Following use of the polishing compositions, the removal rate of each composition, as well as the relative removal of each composition, were determined, with the resulting data set forth in Table 6.

TABLE 6

| Composition | Wt. % Fumed Silica | Wt. % Condensation-polymerized Silica | Wt. % $H_2O_2$ | Wt. % Glycine | Removal Rate [Å/min] |
|---|---|---|---|---|---|
| 6A | 0 | 4 | 1.5 | 1 | 1676 |
| 6B | 1 | 3 | 1.5 | 1 | 2134 |
| 6C | 2 | 2 | 1.5 | 1 | 2388 |
| 6D | 3 | 1 | 1.5 | 1 | 2464 |
| 6E | 4 | 0 | 1.5 | 1 | 432 |

As is apparent from the data set forth in Table 6, the removal rates for the compositions with $H_2O_2$, glycine, and solids comprising a mixture of fumed silica and condensation-polymerized silica (Compositions 6B, 6C, and 6D) were greater than the removal rates for the compositions with $H_2O_2$, glycine, and solids consisting of 4 wt. % fumed silica or 4 wt. % condensation-polymerized silica (Compositions 6A and 6E). These results demonstrate the significance of a combination and a particular ratio of fumed metal oxide and abrasive particles, as well as the presence of two or more chemical accelerators, on the removal rate achievable by the composition of the present invention.

Example 7

This example further illustrates the significance of the combination and ratio of fumed metal oxide to abrasive particles in the composition of the present invention, as well as the combination of chemical accelerators, in maximizing the removal rate of a surface during planarization or polishing of that surface.

Nickel-phosphor plated memory or rigid disks were polished separately with five different compositions with 4 wt. % total solids concentrations comprising varying concentrations of fumed silica (i.e., 0 wt. %, 1 wt. %, 2 wt. %, 3 wt. %, and 4 wt. %) and condensation-polymerized silica (i.e., 4 wt. %, 3 wt. %, 2 wt. %, 1 wt. %, and 0 wt. %) (measured median particle size of about 20 nm, $\sigma_g$=2.26), 1.5 wt. % of a first chemical accelerator (i.e., $H_2O_2$), and 1 wt. % of a second chemical accelerator (i.e., sodium tripolyphosphate (STP)). All of the compositions had a pH of about 2.5. The fumed silica was added to the compositions in the form of Cab-O-Sperse® SC-1 fumed silica aqueous dispersion (Cabot Corporation). The condensation-polymerized silica was Bindzil® 50/80 (Akzo-Nobel), wherein about 90% or more of the particles thereof (by number) have a particle size no greater than 100 nm and about 90% or more of the particles thereof (by number) have a particle size no less than 5 nm. Following use of the polishing compositions, the removal rate of each composition, as well as the relative removal of each composition, were determined, with the resulting data set forth in Table 7.

TABLE 7

| Composition | Wt. % Fumed Silica | Wt. % Condensation-polymerized Silica | Wt. % $H_2O_2$ | Wt. % STP | Removal Rate [Å/min] |
| --- | --- | --- | --- | --- | --- |
| 7A | 0 | 4 | 1.5 | 0.5 | 1702 |
| 7B | 1 | 3 | 1.5 | 0.5 | 1753 |
| 7C | 2 | 2 | 1.5 | 0.5 | 1930 |
| 7D | 3 | 1 | 1.5 | 0.5 | 2311 |
| 7E | 4 | 0 | 1.5 | 0.5 | 356 |

As is apparent from the data set forth in Table 7, the removal rates for the compositions with $H_2O_2$, STP, and solids comprising a mixture of fumed silica and condensation-polymerized silica (Compositions 7B, 7C, and 7D) were greater than the removal rates for the compositions with $H_2O_2$, STP, and solids consisting of 4 wt. % fumed silica or 4 wt. % condensation-polymerized silica (Compositions 7A and 7E). These results demonstrate the significance of a combination and a particular ratio of fumed metal oxide and abrasive particles, as well as the presence of two or more chemical accelerators, on the removal rate achievable by the composition of the present invention.

All of the references cited herein, including patents, patent applications, and publications, are hereby incorporated in their entireties by reference.

While this invention has been described with an emphasis upon preferred embodiments, it will be obvious to those of ordinary skill in the art that variations of the preferred embodiments may be used and that it is intended that the invention may be practiced otherwise than as specifically described herein. Accordingly, this invention includes all modifications encompassed within the spirit and scope of the invention as defined by the following claims.

What is claimed is:

1. A method of planarizing or polishing a surface comprising contacting a surface with a composition comprising (a) a liquid carrier, (b) a chemical accelerator, wherein the chemical accelerator is (i) an oxidizer selected from the group consisting of oxidizing metal salts, oxidizing metal complexes, nonmetallic oxidizing acids, ammonium salts, phosphonium salts, and trioxides, (ii) a sulfur-containing compound selected from the group consisting of thiols, thioesters, and thioethers, (iii) a nitrogen-containing compound selected from the group consisting of imines, amides, imides, iminodiacetic acid, oligomeric imines, oligomeric amides, oligomeric imides, polymeric imines, polymeric amides, and polymeric imides, (iv) a phosphate ion, (v) a phosphonate ion, or a combination thereof, and (c) solids comprising about 5–90 wt. % of fumed metal oxide and about 10–95 wt. % of abrasive particles, wherein about 90% or more of the abrasive particles (by number) have a particle size no greater than 100 nm.

2. The method of claim 1, wherein the surface is a memory or rigid disk surface.

3. The method of claim 2, wherein the memory or rigid disk surface is a nickel-phosphor surface.

4. The method of claim 1, wherein the solids have a packing density of at least about 0.3.

5. The method of claim 1, wherein the solids comprise about 15–75 wt. % of fumed metal oxide and about 25–85 wt. % of abrasive particles.

6. The method of claim 1, wherein the fumed metal oxide is fumed silica.

7. The method of claim 1, wherein the abrasive particles are condensation-polymerized metal oxide particles.

8. The method of claim 1, wherein the fumed metal oxide is fumed silica and the abrasive particles are condensation-polymerized silica particles.

9. The method of claim 1, wherein about 98% or more of the abrasive particles (by number) have a particle size no greater than 100 nm.

10. The method of claim 9, wherein substantially all of the abrasive particles (by number) have a particle size no greater than 100 nm.

11. The method of claim 1, wherein about 95% or more of the abrasive particles (by number) have a particle size no less than 5 nm.

12. The method of claim 11, wherein substantially all of the abrasive particles (by number) have a particle size no less than 5 nm.

13. The method of claim 1, wherein the abrasive particles have a particle size distribution of abrasive particles characterized by a geometric standard deviation by number ($\sigma_g$) of at least about 1.3.

14. The method of claim 1, wherein the solids are present in a concentration of about 0.1–40 wt. % of the composition.

15. A method of planarizing or polishing a surface comprising contacting a surface with a composition comprising (a) a liquid carrier, (b) two or more chemical accelerators, and (c) solids comprising about 5–90 wt. % of fumed metal oxide and about 10–95 wt. % of abrasive particles, wherein about 90% or more of the abrasive particles (by number) have a particle size no greater than 100 nm.

16. The method of claim 15, wherein the surface is a memory or rigid disk surface.

17. The method of claim 16, wherein the memory or rigid disk surface is a nickel-phosphor surface.

18. The method of claim 15, wherein the solids have a packing density of at least about 0.3.

19. The method of claim 15, wherein the solids comprise about 15–75 wt. % of fumed metal oxide and about 25–85 wt. % of abrasive particles.

20. The method of claim 15, wherein the fumed metal oxide is fumed silica.

21. The method of claim 15, wherein the abrasive particles are condensation-polymerized metal oxide particles.

22. The method of claim 15, wherein the fumed metal oxide is fumed silica and the abrasive particles are condensation-polymerized silica particles.

23. The method of claim 15, wherein about 98% or more of the abrasive particles (by number) have a particle size no greater than 100 nm.

24. The method claim 23, wherein substantially all of the abrasive particles (by number) have a particle size no greater than 100 nm.

25. The method of claim 15, wherein about 95% or more of the abrasive particles (by number) have a particle size no less than 5 nm.

26. The method of claim 25, wherein substantially all of the abrasive particles (by number) have a particle size no less than 5 nm.

27. The method of claim 15, wherein the abrasive particles have a particle size distribution of abrasive particles characterized by a geometric standard deviation by number ($\sigma_g$) of at least about 1.3.

28. The method of claim 15, wherein the solids are present in a concentration of about 0.1–40 wt. % of the composition.

29. The method of claim 28, wherein the carrier is water.

30. The method of claim 15, wherein the composition comprises an oxidizing agent and a complexing agent.

31. The method of claim 30, wherein the complexing agent is selected from the group consisting of an amine-containing compound, a source of phosphate ions, a source of phosphonate ions, a carboxylate, and combinations thereof.

32. The method of claim 31, wherein the composition comprises hydrogen peroxide and glycine.

* * * * *